(12) United States Patent
Compton et al.

(10) Patent No.: US 7,678,702 B2
(45) Date of Patent: Mar. 16, 2010

(54) CMP COMPOSITION OF BORON SURFACE-MODIFIED ABRASIVE AND NITRO-SUBSTITUTED SULFONIC ACID AND METHOD OF USE

(75) Inventors: Timothy Frederick Compton, Casa Grande, AZ (US); Junaid Ahmed Siddiqui, Richmond, VA (US); Ajoy Zutshi, Chandler, AZ (US)

(73) Assignee: Air Products and Chemicals, Inc., Allentown, PA (US)

( * ) Notice: Subject to any disclaimer, the term of this patent is extended or adjusted under 35 U.S.C. 154(b) by 0 days.

(21) Appl. No.: 11/509,223

(22) Filed: Aug. 24, 2006

(65) Prior Publication Data

US 2007/0054495 A1    Mar. 8, 2007

Related U.S. Application Data

(60) Provisional application No. 60/712,773, filed on Aug. 31, 2005.

(51) Int. Cl.
*H01L 21/302* (2006.01)
*H01L 21/461* (2006.01)

(52) U.S. Cl. .................. 438/691; 438/692; 438/693; 438/695; 257/E21.23; 257/E21.304

(58) Field of Classification Search ......... 438/691–695; 257/E21.23, E21.304
See application file for complete search history.

(56) References Cited

U.S. PATENT DOCUMENTS

| | | |
|---|---|---|
| 6,190,237 B1 | 2/2001 | Huynh et al. |
| 6,238,272 B1 | 5/2001 | Tanaka et al. |
| 6,361,402 B1 | 3/2002 | Canaperi et al. |
| 6,527,622 B1 | 3/2003 | Brusic et al. |
| 6,705,926 B2 | 3/2004 | Zhou et al. |
| 6,743,267 B2 * | 6/2004 | Jernakoff et al. ............... 51/307 |
| 6,750,128 B2 | 6/2004 | Seiichi et al. |
| 6,852,632 B2 | 2/2005 | Wang et al. |
| 7,247,566 B2 * | 7/2007 | Carter et al. ................. 438/692 |
| 2003/0181142 A1 | 9/2003 | Thesauro et al. |
| 2004/0171264 A1 * | 9/2004 | Kondo et al. ................. 438/691 |
| 2004/0173574 A1 | 9/2004 | Grunwald |
| 2004/0180612 A1 | 9/2004 | Zhou et al. |
| 2005/0028449 A1 | 2/2005 | Miyata et al. |
| 2005/0090109 A1 | 4/2005 | Carter et al. |
| 2006/0046490 A1 * | 3/2006 | Banerjee et al. ............. 438/692 |
| 2006/0068589 A1 | 3/2006 | Bian |
| 2006/0131275 A1 | 6/2006 | Bian |

FOREIGN PATENT DOCUMENTS

WO    WO2004/101222    11/2004

OTHER PUBLICATIONS

Gregory B. Shinn et al, Chemical-Mechanical Polish, Handbook of Semiconductor Mfg. Tech., Chapter 15, 2000, pp. 415-460.
B.L. Mueller, et al, "Polishing Surfaces for Integrated Circuits," Chemtech, Feb. 1998, pp. 38-46.
H. Landis, et al, "Integration of Chemical-Mechanical Polishing Into CMOS integrated Circuit Manufacturing," Thin Solids Films, 1993, P. 1-7, vol. 220.
Kumar, et al, "Chemical-Mechanical Polishing of Copper in Glycerol Based Slurries," Mat. Res. Soc. Symp. Proc., 1996, vol. 427.
Gutmann, et al, "Chemical-Mechanical Polishing of Copper with Oxide and Polymer Interlevel Dielectrics," Thin Solid Films 270, 1995, p. 596-6000.
Luo, et al, "Stabilization of Alumina Slurry for Chemical-Mechanical Polishing of Copper," Langmuir, 1996, p. 3563-3566, vol. 12.
Carpio, et al, "Initial Study on Copper CMP Slurry Chemistries," Thin Solid Films 266, 1995, p. 238-244.
D. Zeidler, et al, "The Interaction Between Different Barrier Metals . . . ," Micro. Engineering, 1997, P. 237-243, vols. 37-38.

* cited by examiner

*Primary Examiner*—Hsien-ming Lee
(74) *Attorney, Agent, or Firm*—Lina Yang

(57) ABSTRACT

A composition and associated method for chemical mechanical planarization (or other polishing) are described. The composition contains a boron surface-modified abrasive, a nitro-substituted sulfonic acid compound, a per-compound oxidizing agent, and water. The composition affords high removal rates for barrier layer materials in metal CMP processes. The composition is particularly useful in conjunction with the associated method for metal CMP applications (e.g., step 2 copper CMP processes).

23 Claims, No Drawings

US 7,678,702 B2

CMP COMPOSITION OF BORON SURFACE-MODIFIED ABRASIVE AND NITRO-SUBSTITUTED SULFONIC ACID AND METHOD OF USE

CROSS-REFERENCE TO RELATED APPLICATIONS

This application claims benefit of U.S. Provisional Application No. 60/712,773, filed Aug. 31, 2005. The disclosure of this provisional application is hereby incorporated by reference.

FIELD OF THE INVENTION

This invention relates to an improved composition and process for the chemical mechanical polishing or planarization of semiconductor wafers. More particularly, it relates to such a composition and process tailored to meet more stringent requirements of advanced integrated circuit fabrication.

The invention relates to chemical mechanical polishing of substrates using a boron surface-modified abrasive and a fluid composition comprising a nitro-substituted sulfonic acid compound and a per-compound oxidizing agent, and particularly relates to a method of polishing substrates comprising copper, at least one barrier material, and at least one dielectric material using a chemical-mechanical polishing system comprising a boron surface-modified abrasive, a nitro-substituted sulfonic acid compound, and a per-compound oxidizing agent.

BACKGROUND OF THE INVENTION

This invention relates generally to the chemical-mechanical polishing (CMP) of metal substrates on semiconductor wafers and slurry compositions therefor. In particular, the present invention relates to a CMP slurry composition which is characterized to enhance removal of barrier layer materials in relation to low-k dielectric materials, PETEOS dielectric layer materials, and copper; and to provide for the selective removal of barrier layer materials in relation to copper, low-k dielectric materials, and PETEOS dielectric layer materials, during CMP processing of substrates comprised of metal, barrier layer materials, and dielectric layer materials. This invention is especially useful for metal CMP and most especially for step 2 copper CMP processes.

Chemical mechanical planarization (chemical mechanical polishing, CMP) for planarization of semiconductor substrates is now widely known to those skilled in the art and has been described in numerous patents and open literature publications. Some introductory references on CMP are as follows: "Polishing Surfaces for Integrated Circuits", by B. L. Mueller and J. S. Steckenrider, Chemtech, February, 1998, pages 38-46; H. Landis et al., Thin Solids Films, 220 (1992), page 1; and "Chemical-Mechanical Polish" by G. B. Shinn et al., Chapter 15, pages 415-460, in Handbook of Semiconductor Manufacturing Technology, editors: Y. Nishi and R. Doering, Marcel Dekker, New York City (2000).

In a typical CMP process, a substrate (e.g., a wafer) is placed in contact with a rotating polishing pad attached to a platen. A CMP slurry, typically an abrasive and chemically reactive mixture, is supplied to the pad during CMP processing of the substrate. During the CMP process, the pad (fixed to the platen) and substrate are rotated while a wafer carrier system or polishing head applies pressure (downward force) against the substrate. The slurry accomplishes the planarization (polishing) process by chemically and mechanically interacting with the substrate film being planarized due to the effect of the downward force and the rotational movement of the pad relative to the substrate. Polishing is continued in this manner until the desired film on the substrate is removed with the usual objective being to effectively planarize the substrate. Typically metal CMP slurries contain an abrasive material, such as silica or alumina, suspended in an oxidizing, aqueous medium.

Silicon based semiconductor devices, such as integrated circuits (ICs), typically include a dielectric layer. Multilevel circuit traces, typically formed from aluminum or an aluminum alloy or copper, are patterned onto the dielectric layer substrate. There are numerous types of layers that can be polished by CMP, for example, silicon nitride, interlayer dielectrics (ILD) such as silicon oxide and low-k films including carbon-doped oxides; metal layers such as tungsten, copper, aluminum, etc., which are used to connect the active devices; barrier layer materials such as titanium, titanium nitride, tantalum, tantalum nitride, noble metals, etc.

CMP processing is often employed to remove and planarize excess metal at different stages of semiconductor manufacturing. Various metals and metal alloys have been used at different stages of semiconductor manufacturing, including tungsten, aluminum, copper, tantalum, tantalum nitride, titanium, titanium nitride, ruthenium, platinum, iridium, and combinations thereof. For example, one way to fabricate a multilevel copper interconnect or planar copper circuit traces on a dielectric substrate is referred to as the damascene process. In a semiconductor manufacturing process typically used to form a multilevel copper interconnect, metallized copper lines or copper vias are formed by electrochemical metal deposition followed by copper CMP processing. In a typical process, the interlevel dielectric (ILD) surface is patterned by a conventional dry etch process to form vias and trenches for vertical and horizontal interconnects and make connection to the sublayer interconnect structures. The patterned ILD surface typically is coated with an adhesion-promoting layer such as titanium or tantalum and/or a diffusion barrier layer such as titanium nitride or tantalum nitride over the ILD surface and into the etched trenches and vias. The adhesion-promoting layer and/or the diffusion barrier layer is then overcoated with copper, for example, by a seed copper layer and followed by an electrochemically deposited copper layer. Electro-deposition is continued until the structures are filled with the deposited metal. Finally, CMP processing is used to remove the copper overlayer, adhesion-promoting layer, and/or diffusion barrier layer, until a planarized surface with exposed elevated portions of the dielectric (silicon dioxide and/or low-k) surface is obtained. The vias and trenches remain filled with electrically conductive copper forming the circuit interconnects. The adhesion-promoting layer plus diffusion barrier layer is typically collectively referred to as the "barrier layer."

A multi-step copper CMP process may be employed to achieve local and global planarization in the production of IC chips, referred to as a step 1 copper CMP process, followed by a barrier layer CMP process. In relation to copper CMP, the current state of this technology involves use of a two-step process. During step 1 of a copper CMP process, the overburden copper is removed and planarized. Then step 2 of the copper CMP process follows to remove the barrier layer materials and achieve both local and global planarization. The barrier layer CMP process is frequently referred to as a barrier or step 2 copper CMP process. The ratio of the removal rate of copper to the removal rate of dielectric material is called the selectivity for removal of copper in relation to dielectric material during CMP processing of substrates comprised of copper, barrier layer materials, and dielectric material. The ratio of the removal rate of barrier layer materials to the removal rate of copper is called the selectivity for removal of barrier layer materials in relation to copper during CMP processing of substrates comprised of copper, barrier layer materials, and dielectric materials. Barrier layer materials include tantalum, tantalum nitride, tungsten, noble metals such as ruthenium and ruthenium oxide, and combinations thereof.

When CMP slurries over-polish copper layers they may create a depression or "dishing" effect in the copper vias and trenches. This feature distortion is unacceptable due to lithographic and other constraints in semiconductor manufacturing. Another feature distortion that is unsuitable for semiconductor manufacturing is called "erosion." Erosion is the topography difference between a field of dielectric and a dense array of copper vias or trenches. In CMP, the materials in the dense array may be removed or eroded at a faster rate than the surrounding field of dielectric. This causes a topography difference between the field of dielectric and the dense copper array.

A number of systems for CMP of copper have been disclosed. A few illustrative examples are listed next. Kumar et al. in an article entitled "Chemical-Mechanical Polishing of Copper in Glycerol Based Slurries" (*Materials Research Society Symposium Proceedings,* 1996) disclose a slurry that contains glycerol and abrasive alumina particles. An article by Gutmann et al. entitled "Chemical-Mechanical Polishing of Copper with Oxide and Polymer Interlevel Dielectrics" (*Thin Solid Films,* 1995) discloses slurries based on either ammonium hydroxide or nitric acid that may contain benzotriazole (BTA) as an inhibitor of copper dissolution. Luo et al. in an article entitled "Stabilization of Alumina Slurry for Chemical-Mechanical Polishing of Copper" (*Langmuir,* 1996) discloses alumina-ferric nitrate slurries that contain polymeric surfactants and BTA. Carpio et al. in an article entitled "Initial Study on Copper CMP Slurry Chemistries" (*Thin Solid Films,* 1995) disclose slurries that contain either alumina or silicon particles, nitric acid or ammonium hydroxide, with hydrogen peroxide or potassium permanganate as an oxidizer.

Generally, after removal of overburden copper in step 1, polished wafer surfaces have non-uniform local and global planarity due to differences in the step heights at various locations of the wafer surfaces. Low density features tend to have higher copper step heights whereas high density features tend to have low step heights. Due to differences in the step heights after step 1, selective slurries are highly desirable for step 2 copper CMP for the selective removal of barrier layer materials in relation to copper and for the selective removal of dielectric materials in relation to copper.

A typically used CMP slurry has two actions, a chemical component and a mechanical component. There are a number of theories as to the mechanism for chemical mechanical polishing of copper. An article by Zeidler et al. (*Microelectronic Engineering,* 1997) proposes that the chemical component forms a passivation layer on the copper changing the copper to a copper oxide. The copper oxide has different mechanical properties, such as density and hardness, than metallic copper and passivation changes the polishing rate of the abrasive portion. The above article by Gutmann et al. discloses that the mechanical component abrades elevated portions of copper and the chemical component then dissolves the abraded material. The chemical component also passivates recessed copper areas minimizing dissolution of those portions.

In the case of CMP of metals, the chemical action is generally considered to take one of two forms. In the first mechanism, the chemicals in the solution react with the metal layer to continuously form an oxide layer on the surface of the metal. This generally requires the addition of an oxidizer to the solution such as hydrogen peroxide, ferric nitrate, etc. Then the mechanical abrasive action of the particles continuously and simultaneously removes this oxide layer. A judicious balance of these two processes obtains optimum results in terms of removal rate and polished surface quality.

In the second mechanism, no protective oxide layer is formed. Instead, the constituents in the solution chemically attack and dissolve the metal, while the mechanical action is largely one of mechanically enhancing the dissolution rate by such processes as continuously exposing more surface area to chemical attack, raising the local temperature (which increases the dissolution rate) by the friction between the particles and the metal, and enhancing the diffusion of reactants and products to and away from the surface by mixing and by reducing the thickness of the boundary layer.

BRIEF SUMMARY OF THE INVENTION

In one embodiment, the invention is a chemical-mechanical planarization composition comprising:
 a) a boron surface-modified abrasive;
 b) a nitro-substituted sulfonic acid compound;
 c) an oxidizing agent; and
 d) water.

The polishing composition is useful in chemical-mechanical polishing (CMP), and especially in metal CMP for the planarization of silicon based semiconductor devices, such as integrated circuits and memory devices.

In another embodiment, the invention is a chemical-mechanical planarization composition comprising:
 a) a boron surface-modified abrasive;
 b) a nitro-substituted sulfonic acid compound;
 c) an oxidizing agent; and
 d) water;

wherein the boron surface-modified abrasive is present at a weight percent level in the composition ranging from about 0.5 weight % to about 5 weight %, wherein the nitro-substituted sulfonic acid compound is present at a weight percent level in the composition ranging from about 0.5 weight % to about 6 weight %, and wherein the oxidizing agent is a percompound present at a level ranging from 0.5 weight % to 6 weight % of the total weight of the composition.

In an additional embodiment, the invention is a method of step 2 chemical-mechanical planarization comprising the steps of:
 A) placing a substrate comprising copper, at least one dielectric material and at least one barrier material in contact with a polishing pad;
 B) delivering a chemical-mechanical planarization composition comprising a) a boron surface-modified abrasive; b) a nitro-substituted sulfonic acid compound; c) an oxidizing agent; and d) water; and
 C) polishing the substrate with the polishing step 2 copper chemical-mechanical planarization composition.

In another embodiment, the invention is a method of step 2 copper chemical-mechanical planarization, said method comprising the steps of:
 A) placing a substrate comprising copper, at least one dielectric material and at least one barrier material in contact with a polishing pad;
 B) delivering a chemical-mechanical planarization composition comprising a) a boron surface-modified abrasive present at a weight percent level in the composition ranging from about 0.5 weight % to about 5 weight %; b) a nitro-substituted sulfonic acid compound present at a weight percent level in the composition ranging from about 0.5 weight % to about 6 weight %; c) a per-compound oxidizing agent present at a level ranging from 0.5 weight % to 6 weight % of the total weight of the composition; and d) water;

C) polishing the substrate with the step 2 copper chemical-mechanical planarization composition.

DETAILED DESCRIPTION OF THE INVENTION

It has been found that CMP polishing compositions comprising a boron surface-modified abrasive, a nitro-substituted sulfonic acid compound, a per-compound oxidizing agent, and water possess high removal rates for barrier layer material (e.g., tantalum nitride) in relation to low-k dielectric layer materials (e.g., Black Diamond), metal (e.g., copper) and PETEOS dielectric materials; and provide for the selective removal of barrier layer materials, copper, low-k dielectric layer materials, and PETEOS dielectric layer materials; during CMP processing. Consequently these polishing compositions are particularly useful in copper CMP processing (e.g., step 2 copper CMP). Optionally, other additives may be included.

Suitable nitro-substituted sulfonic acid compounds for this invention include, but are not limited to, compounds having the structure $(NO_2)_n$—R—$(SO_3H)_m$, or the salt $(NO_2)_n$—R—$(SO_3^-)_m$, where n is an integer 1, 2 or 3 and m is an integer 1, 2 or 3. The sulfonic acid moiety —$SO_3H$ and the sulfonate moiety R—$SO_3^-$ are used interchangeably herein. The nitro-substituted sulfonic acid compounds of the current invention advantageously comprise at least one nitro substituted onto a ring structure and at least one sulfonate substituted onto a ring structure. The preferred class of nitro-substituted sulfonic acid compounds are those comprising one or more nitro moieties and one or more sulfonate moieties attached to a (multi-)cyclic aromatic ring, e.g., where R is a phenyl ring. Another useful class of nitro-substituted sulfonic acid compounds are those comprising one or more nitro moieties and one or more sulfonate moieties attached to an organic portion containing a single-ring or double-ring structure, where the ring(s) can be cyclic (i.e., comprise a plurality of carbon atoms) or heterocyclic (i.e., comprise one or more carbon atoms and a heteroatom, e.g., at least one N, at least one S, at least one O, or a combination thereof. In some embodiments more than one nitro moiety is attached to a ring structure described above. In some embodiments more than one sulfonate moiety is attached to a ring structure described above. While there can in less preferred embodiments be a small, e.g., $C_1$ to $C_3$, alkyl chain between the aromatic ring and the nitro and/or sulfonate group, the preferred structure has a nitro and/or sulfonate moiety attached directly to the ring structure, for example to a benzene ring.

In other preferred embodiments, the nitro-substituted sulfonic acid compounds can have a ring structure with a nitro moiety and a sulfonate moiety attached and at least one other functional moiety (referred to herein as "polar substituents" or "polar groups," for convenience purposes only and without any intent to limit) also attached, e.g., another nitro moiety, another sulfonate moiety, a sulfate moiety, an amino moiety, a nitroso moiety, a hydroxyl moiety, a carboxylate moiety (—COOH, —COOR, or —COO$^-$R$^+$), an alkoxy moiety such as a methoxy group, or the like, or a combination thereof.

Another useful class of nitro-substituted sulfonic acid compounds are those comprising one or more nitro moieties and one or more sulfonate moieties attached to a ring structure where the ring is heterocyclic (i.e., comprises at least one C and one or more of N, S, and O). Advantageously, the nitro group and sulfonate group are attached to a ring carbon.

The particular nitro-substituted sulfonic acid compounds useful with particular substrates can be easily determined by one of ordinary skill in the art with the benefit of this disclosure. A preferred nitro-substituted sulfonic acid compound is 3-nitrobenzenesulfonic acid or 2,4-dinitrobenzenesulfonic acid. In another embodiment other nitro-substituted sulfonic acid compounds include 2-nitrobenzenesulfonic acid; 4-nitrobenzenesulfonic acid; 2,3-dinitrobenzenesulfonic acid; 2,5-dinitrobenzenesulfonic acid; 2,6-dinitrobenzenesulfonic acid; 3,5-dinitrobenzenesulfonic acid; 2,4,6-trinitrobenzenesulfonic acid; 2-nitro-benzene-1,4-disulfonic acid; 2-nitronaphthalenesulfonic acid; 3-nitronaphthalenesulfonic acid; and the like.

Of course, any of the above polar substituents can be admixed, to make for example 3-nitro-4-hydroxy-benzenesulfonic acid; 3-nitro-5-hydroxy-benzenesulfonic acid; 2-nitro-4-hydroxy-benzenesulfonic acid; 2-hydroxy-4-nitro-benzenesulfonic acid; 2-carboxy-4-nitrobenzenesulfonic acid (i.e., 4-nitro-2-sulfo-benzoic acid); and the like.

The benzene ring is not the only ring structure useful for this invention. One or more nitro moieties and one or more sulfonate moieties can be attached to any 5- or 6-membered ring (e.g., aromatic ring), or less preferably to a double ring structure, again with the optional functional groups (e.g., hydroxyl, and/or amino groups) attached thereto. For example, other useful nitro-substituted sulfonic acid compounds include, for example, 3-nitro-2-pyridinesulfonic acid. Additionally or alternately, instead of a pyridine, naphthyl, or phenyl ring structure, the nitro-substituted sulfonic acid compounds can have a different aromatic or aromatic-containing ring structure, including but not limited to a fluorene, anthracene, pyrene, biphenyl, quadrene, pyridazine, bipyridine, quinoline, phenanthroline, phenanthridine, pyrimidine, pyrazine, triazine, benzothiazole, benzotriazole, benzimidazole, or the like.

In addition to or as an alternative to the disclosed additional functional moiety(ies) on the nitro-substituted sulfonic acid compounds, in some embodiments it may be acceptable or even desirable for relatively non-polar groups such as alkyl moieties, hydrocarbon moieties, and/or halides, to be attached, e.g., to the ring structure. Examples of such compounds can include, but are not limited to, for example, 2-chloro-5-nitrobenzenesulfonic acid, 2-methyl-5-nitrobenzenesulfonic acid, and the like.

Of course, the invention encompasses compositions and slurries containing one or a plurality of nitro-substituted sulfonic acid compounds as exemplified above. Additionally, the invention encompasses salts of any and each nitro-substituted sulfonic acid compounds.

The amount of the nitro-substituted sulfonic acid compounds present is advantageously between about 0.1 weight % to about 20 weight %, for example between about 1 weight % and about 15 weight %, based on the weight of the slurry.

In one embodiment, the amount of nitro-substituted sulfonic acid compounds of the current invention range from between about 0.5 weight % and about 6 weight % by weight, based on the weight of the slurry.

Suitable boron surface-modified abrasives for this invention include, but are not limited to, boron surface-modified abrasives obtained by treatment of an unmodified silica with boric acid. The boron surface-modified abrasives of the current invention advantageously comprise boron surface-modified silica. A preferred class of boron surface-modified abrasives of this invention is boron surface-modified colloidal silica. The boron surface-modified abrasive is present in the slurry in a concentration of about 0.001 weight % to about 30 weight % of the total weight of the slurry. In one embodiment, the boron surface-modified abrasive is present in a concentration of about 1 weight % to about 20 weight % of the total weight of the slurry. In another embodiment, the boron surface-modified abrasive is present in a concentration of about 0.5 weight % to about 5 weight % of the total weight of the slurry. In yet another embodiment, the boron surface-modified abrasive is present in a concentration of about 0.01 weight % to about 5 weight % of the total weight of the slurry.

In another embodiment other both standard (unmodified) abrasives and surface-modified abrasives can also be employed in this invention. Suitable unmodified abrasives include, but are not limited to, silica, alumina, titania, zirconia, germania, ceria, and co-formed products thereof, and mixtures thereof. A surface-modified abrasive obtained by treatment of an unmodified abrasive (e.g., silica) with an inorganic or organometallic compound can also be employed in this invention. Suitable inorganic compounds for modification include sodium aluminate and potassium aluminate. Suitable organometallic compounds for modification include aluminum acetate, aluminum formate, and aluminum propionate. Suitable abrasives include, but are not limited to, colloidal products, fumed products, and mixtures thereof. Some specific examples of surface modified abrasives are modification of silica with sodium aluminate or potassium aluminate to give sodium aluminate surface-modified silica or to give potassium aluminate surface-modified silica. Silica and surface-modified silica are a preferred abrasive material used in the present invention. The silica may be, for example, colloidal silica, fumed silica and other silica dispersions; however, the preferred silica is colloidal silica or surface-modified colloidal silica. The standard (unmodified) abrasive, if present, and the surface-modified abrasive are present in the slurry in a combined concentration of about 0.001 weight % to about 30 weight % of the total weight of the slurry. In one embodiment, the standard (unmodified) abrasive, if present, and the surface-modified abrasive are present in a combined concentration of about 1 weight % to about 20 weight % of the total weight of the slurry. In another embodiment, the standard (unmodified) abrasive, if present, and the surface-modified abrasive are present in a combined concentration of about 0.01 weight % to about 5 weight % of the total weight of the slurry.

The per-compound oxidizing agent can be any suitable per-compound oxidizing agent. Suitable per-compound oxidizing agents include, for example, one or more per-compounds, which comprise at least one peroxy group (—O—O—). Suitable per-compounds include, for example, peroxides, persulfates (e.g., monopersulfates and dipersulfates), percarbonates, and acids thereof, and salts thereof, and mixtures thereof. Preferred per-compound oxidizing agents include, for example, hydrogen peroxide, urea-hydrogen peroxide, sodium peroxide, benzyl peroxide, di-t-butyl peroxide, peracetic acid, monopersulfuric acid, dipersulfuric acid, and salts thereof, and mixtures thereof. The per-compound oxidizing agent in the compositions of this invention is present in the slurry in a concentration of about 0.02 weight % to about 10 weight %. In one embodiment, the per-compound oxidizing agent is present in a concentration of about 0.05 weight % to about 5 weight % of the total weight of the slurry.

Hydrogen peroxide is used as a preferred per-compound oxidizing agent. Preferably the concentration of the hydrogen peroxide is from about 0.5 weight % to about 6 weight % of the total weight of the slurry. In another embodiment, the concentration of the hydrogen peroxide is from about 0.05 weight % to about 6 weight % of the total weight of the slurry.

Other chemicals that may be added to the CMP slurry composition include, for example, additional oxidizing agents, water-miscible solvents, surfactants, pH adjusting agents, acids, corrosion inhibitors, fluorine-containing compounds, chelating agents, non-polymeric nitrogen-containing compounds, and salts.

The additional oxidizing agent can be any suitable oxidizing agent. In preferred embodiments, the polishing composition or slurry comprising a boron surface-modified abrasive, nitro-substituted sulfonic acid compounds and per-compound oxidizing agent of this invention are substantially free of hydroxylamines, or adducts or salts (i.e., derivatives) thereof, or combinations thereof. As used herein, the term substantially free as it pertains to additional oxidizing agents means less than about 0.1 weight % of the total weight of the slurry, for example less than about 0.01 weight %, and most preferably completely free of the component. Salts of hydroxylamines include hydroxylamine nitrate, hydroxylamine sulfate, hydroxylamine phosphate, and the like. Adducts of hydroxylamine include the compound where each R of the $R_2N$—OR compound is independently hydrogen or a linear, branched, or cyclic hydrocarbon containing from 1 to 7 carbon atoms. Adducts of hydroxylamine can be present in salt form as well, e.g., as nitrates, sulfates, phosphates, or the like, or a combination thereof. Suitable additional oxidizing agents include, for example, oxidized halides (e.g., chlorates, bromates, iodates, perchlorates, perbromates, periodates, and acids thereof, and mixtures thereof, and the like), perboric acid, perborates, percarbonates, peroxyacids (e.g., peracetic acid, perbenzoic acid, m-chloroperbenzoic acid, salts thereof, mixtures thereof, and the like), permanganates, chromates, cerium compounds, ferricyanides (e.g., potassium ferricyanide), mixtures thereof, and the like. Preferred additional oxidizing agents include, for example, iodic acid, and salts thereof, and mixtures thereof. The additional oxidizing agent may be present in the slurry composition in a concentration of about 0 weight % to about 10 weight %. In one embodiment, the additional oxidizing agent is present in a concentration of about 0.05 weight % to about 5 weight % of the total weight of the slurry.

Suitable water-miscible solvents that may be added to the slurry composition include, for example, ethyl acetate, methanol, ethanol, propanol, isopropanol, butanol, glycerol, ethylene glycol, and propylene glycol, and mixtures thereof. The water-miscible solvents may be present in the slurry composition in a concentration of about 0 weight % to about 4 weight % in one embodiment, of about 0.1 weight % to about 2 weight % in another embodiment, and, in a concentration of about 0.5 weight % to about 1 weight % in yet another embodiment; each of these weight % values is based on the total weight of the slurry. The preferred types of water-miscible solvents are isopropanol, butanol, and glycerol.

Suitable surfactant compounds that may be added to the slurry composition include, for example, any of the numerous nonionic, anionic, cationic or amphoteric surfactants known to those skilled in the art. The surfactant compounds may be present in the slurry composition in a concentration of about 0 weight % to about 1 weight % in one embodiment, of about 0.0005 weight % to about 1 weight % in another embodiment, and, in a concentration of about 0.001 weight % to about 0.5 weight % in yet another embodiment; each of these weight % values is based on the total weight of the slurry. The preferred types of surfactants are nonionic, anionic, or mixtures thereof and are most preferably present in a concentration of about 10 ppm to about 1000 ppm of the total weight of the slurry. Nonionic surfactants are most preferred.

The pH-adjusting agent is used to improve the stability of the polishing composition, to improve the safety in use or to meet the requirements of various regulations. As a pH-adjusting agent to be used to lower the pH of the polishing composition of the present invention, hydrochloric acid, nitric acid, sulfuric acid, chloroacetic acid, tartaric acid, succinic acid, citric acid, malic acid, malonic acid, various fatty acids, various polycarboxylic acids may be employed. On the other hand, as a pH-adjusting agent to be used for the purpose of raising the pH, potassium hydroxide, sodium hydroxide, ammonia, tetramethylammonium hydroxide, ethylenediamine, piperazine, polyethyleneimine, etc., may be employed. The polishing composition of the present invention is not particularly limited with respect to the pH, but it is usually adjusted to pH 5 to 11. In one embodiment, a suitable slurry pH is from about 5 to about 11. In another embodiment, a suitable slurry pH is from about 6 to about 10.

Other suitable acid compounds that may be added (in place of or in addition to the pH-adjusting acids mentioned supra) to the slurry composition include, but are not limited to, formic acid, acetic acid, propanoic acid, butanoic acid, pentanoic acid, hexanoic acid, heptanoic acid, octanoic acid, nonanoic acid, lactic acid, hydrochloric acid, nitric acid, phosphoric acid, sulfuric acid, hydrofluoric acid, malic acid, tartaric acid, gluconic acid, citric acid, phthalic acid, pyrocatechoic acid, pyrogallol carboxylic acid, gallic acid, tannic acid, and mixtures thereof. These acid compounds may be present in the slurry composition in a concentration of about 0 weight % to about 5 weight % of the total weight of the slurry.

Suitable corrosion inhibitors that may be added to the slurry composition include, for example, 1,2,4-triazole, benzotriazole, 6-tolylytriazole, tolyltriazole derivatives, 1-(2,3-dicarboxypropyl)benzotriazole, branched-alkylphenol-substituted-benzotriazole compounds, TINUVIN® 99-2, TINUVIN® 109, TINUVIN® 213, TINUVIN® 234, TINUVIN® 326, TINUVIN® 328, TINUVIN® 329, TINUVIN® 384-2, N-acyl-N-hydrocarbonoxyalkyl aspartic acid compounds, and mixtures thereof. The corrosion inhibitor may be present in the slurry in a concentration of about 0 ppm to about 4000 ppm in an embodiment, from about 10 ppm to about 4000 ppm in another embodiment, and from about 50 ppm to about 2000 ppm in yet another embodiment, all based on the total weight of the slurry. Preferred corrosion inhibitors are 1,2,4-triazole, TINUVIN® 109, TINUVIN® 328, TINUVIN® 329, CDX2128 and CDX2165. CDX2128 and CDX2165 are supplied by King Industries, and are preferably present in a concentration of about 0 ppm to about 1000 ppm of the total weight of the slurry. TINUVIN® 109, TINUVIN® 328, and TINUVIN® 329 are supplied by Ciba Specialty Chemicals Corporation, and are preferably present in a concentration of about 0 ppm to about 500 ppm of the total weight of the slurry.

Carboxylic acids, if added, may also impart corrosion inhibition properties to the slurry composition.

To increase further the selectivity of tantalum and tantalum compounds relative to silicon dioxide, fluorine-containing compounds may be added to the slurry composition. Suitable fluorine-containing compounds include, for example, hydrogen fluoride, perfluoric acid, alkali metal fluoride salt, alkaline earth metal fluoride salt, ammonium fluoride, tetramethylammonium fluoride, ammonium bifluoride, ethylenediammonium difluoride, diethylenetriammonium trifluoride, and mixtures thereof. The fluorine-containing compounds may be present in the slurry composition in a concentration of about 0 weight % to about 5 weight % in an embodiment, preferably from about 0.65 weight % to about 5 weight % in another embodiment, from about 0.5 weight % to about 2 weight % in yet another embodiment, all based on the total weight of the slurry. A suitable fluorine-containing compound is ammonium fluoride.

Suitable chelating agents that may be added to the slurry composition include, but are not limited to, ethylenediaminetetracetic acid, N-hydroxyethylethylenediaminetriacetic acid, nitrilotriacetic acid, diethylenetriaminepentacetic acid, bicine, glycine, tricine, citric acid, 2,3-butanedione dioxime (dimethylglyoxime) and mixtures thereof. The chelating agents may be present in the slurry composition in a concentration of about 0 weight % to about 3 weight % in one embodiment, and in a concentration of about 0.1 weight % to about 2 weight % in another embodiment based on the total weight of the slurry. Preferred chelating agents are bicine, glycine, tricine, citric acid, 2,3-butanedione dioxime and ethylenediaminetetracetic acid. When present, a chelating agent is usually present in a concentration of about 0.1 weight % to about 2.0 weight % of the total weight of the slurry.

Suitable non-polymeric nitrogen-containing compounds (amines, hydroxides, etc.) that may be added to the slurry composition include, for example, ammonium hydroxide, monoethanolamine, diethanolamine, triethanolamine, diethyleneglycolamine, N-hydroxylethylpiperazine, and mixtures thereof. These non-polymeric nitrogen-containing compounds may be present in the slurry composition in a concentration of about 0 weight % to about 1 weight %, and, if present, are normally present at a level of about 0.01 weight % to about 0.2 weight % of the total weight of the slurry. A preferred non-polymeric nitrogen-containing compound is ammonium hydroxide and is most preferably present in a concentration of about 0.01 weight % to about 0.1 weight % of the total weight of the slurry.

Suitable salts that optionally may be added to the slurry composition include, for example, ammonium persulfate, potassium persulfate, potassium sulfite, potassium carbonate, ammonium nitrate, potassium hydrogen phthalate, hydroxylamine sulfate, and mixtures thereof. The salts may be present in the slurry composition in a concentration of about 0 weight % to about 10 weight %, and, if present, are normally present at a level of about 0.02 weight % to about 5 weight % of the total weight of the slurry.

Still other chemicals that can be added to the slurry compositions are biological agents such as bactericides, biocides and fungicides especially if the pH is around about 6 to 9. Suitable biocides, include, but are not limited to, 1,2-benzisothiazolin-3-one; 2(hydroxymethyl)amino ethanol; 1,3-dihydroxymethyl-5,5-dimethylhydantoin; 1-hydroxymethyl-5,5-dimethylhydantion; 3-iodo-2-propynyl-butylcarbamate; glutaraldehyde; 1,2-dibromo-2,4-dicyanobutane; 5-chloro-2-methyl-4-isothiazoline-3-one; 2-methyl-4-isothiazolin-3-one; and mixtures thereof. Preferred biocides are isothiazolines and benzisothiazolines. When present, a biocide is usually present in a concentration of about 0.001 weight % to about 0.1 weight % of the total weight of the slurry.

Associated Methods

The associated methods of this invention entail use of the aforementioned composition (as disclosed supra) for chemical mechanical planarization of substrates comprised of metals, barrier layer materials, and dielectric materials. In the methods, a substrate (e.g., a wafer) is placed face-down on a polishing pad which is fixedly attached to a rotatable platen of a CMP polisher. In this manner, the substrate to be polished and planarized is placed in direct contact with the polishing pad. A wafer carrier system or polishing head is used to hold the substrate in place and to apply a downward pressure against the backside of the substrate during CMP processing while the platen and the substrate are rotated. The polishing composition (slurry) is applied (usually continuously) on the pad during CMP processing to effect the removal of material to planarize the substrate. Since the associated methods of this invention employ the compositions described herein, the ranges (e.g., pH, component levels) described for composition embodiments also apply to corresponding method embodiments.

The composition and associated methods of this invention are effective for CMP of a wide variety of substrates, including substrates having dielectric portions that comprise materials having dielectric constants less than 3.3 (low-k materials). Suitable low-k films in substrates include, but are not limited to, organic polymers, carbon-doped oxides, fluorinated silicon glass (FSG), inorganic porous oxide-like materials, and hybrid organic-inorganic materials. Representative low-k materials and deposition methods for these materials are summarized below.

conditions. This complexation assists in maintaining tantalum ions in solution as nitro-substituted sulfonic acid complexes, resulting in high tantalum nitride removal rates, high selectivity for removal of tantalum nitride in relation to PETEOS ratios at low abrasive concentration, and high selectivity for removal of tantalum nitride in relation to copper ratios at low abrasive concentration. Interestingly, in the presence of hydrogen peroxide and a nitro-substituted sulfonic acid, copper removal rates are much lower than tantalum nitride removal rates. This is possibly due to a much higher passivation rate for copper than tantalum nitride in a mixture of hydrogen peroxide and nitro-substituted sulfonic acid. Unlike hydrogen peroxide, a nitro-substituted sulfonic acid compound serves not only as an oxidant but also to complex tantalum ions. These dual roles result in high tantalum nitride removal rates. The role of surface-modified silica such as boric acid surface-modification is similar to the role of the sulfonic acid group in nitro-substituted sulfonic acid compounds, from the standpoint of the complexing properties of a sulfonic acid group and a boric acid group with tantalum ions. However, there is the distinction that since the boric acid

| Vendor | Trade Name | Deposition Method | Material |
|---|---|---|---|
| Air Products and Chemicals | MesoElk ® | Spin-on | Hybrid organic-inorganic |
| Applied Materials | Black Diamond | CVD | Carbon-doped oxide |
| Dow Chemical | SiLK ™, Porous SiLK ™ | Spin-on | Organic polymer |
| Honeywell Electronic Materials | NANOGLASS ® E | Spin-on | Inorganic oxide-like |
| Novellus Systems | CORAL ® | PECVD | Carbon-doped oxide |

PECVD = Plasma enhanced chemical vapor deposition
CVD = chemical vapor deposition Similarly, the composition and associated methods of this invention are effective for CMP of substrates comprised of various metals, including, but not limited to, tantalum, titanium, tungsten, copper, and noble metals. The composition and associated methods of this invention are particularly useful and preferred in copper CMP processing (e.g., step 2 copper CMP), and provides high removal rates for barrier layer material (e.g., tantalum nitride) in relation to low-k dielectric layer materials (e.g., Black Diamond), PETEOS dielectric materials, and copper (as illustrated in the examples).

While not being bound by any particular theory, the inventors believe that the following considerations may explain why a polishing composition comprising a) a boron surface-modified abrasive, b) a nitro-substituted sulfonic acid compound, c) a per-compound oxidizing agent, and d) water exhibits enhanced barrier layer material removal rates in CMP processing. Typically when a slurry composition is exposed to copper and tantalum nitride with a commonly used oxidizer such as hydrogen peroxide under basic conditions during CMP processing, both copper and tantalum nitride undergo corrosion to form copper and tantalum ions, which forms passive hard copper oxide and tantalum oxide films. This phenomena is well understood, and described in Pourbaix diagrams of copper (pages 385-392) and tantalum (pages 251-255) in Atlas of Electrochemical Equilibria in Aqueous Solutions ($2^{nd}$ Edition), by M. J. N. Pourbaix, published by National Association of Corrosion Engineers, Houston, Tex. (1974). Thus copper and tantalum removal rates are very low. As described in this invention, the addition of a nitro-substituted sulfonic acid compound to a slurry is believed to result in complexation with tantalum ions under basic polishing groups are immobilized on the surface of the silica abrasive, complexes with tantalum ions are formed during the mechanical impact of the abrasive with tantalum nitride during the CMP process. Also, the passivation rate of tantalum ions is much lower than copper in the presence of hydrogen peroxide, so tantalum ions can complex with the boric acid groups. Thus boron (e.g., modified with boric acid) surface-modified silica increases the tantalum nitride removal rate. Unlike tantalum nitride, copper removal rates are low. This is due to the higher passivation rate of copper due to hydrogen peroxide. Since passivated copper oxide films are very hard, the boron surface-modified abrasive has little impact on copper removal rates during the collision of abrasive on the passivated copper oxide surface. Thus a combination of nitro-substituted sulfonic acid compound, hydrogen peroxide, and the chemical-mechanical induced reaction with the boron surface-modified abrasive, provides the synergy in the tantalum nitride removal rate while maintaining low copper rates during the CMP process.

The present invention is further demonstrated by the examples below.

Glossary

Exemplary Components (and Equivalents Thereof)
A) Boron surface-modified colloidal silica: prepared from potassium-stabilized colloidal silica (an approximately 30 weight % potassium-stabilized dispersion in water with a particle size of 50-60 nanometers as measured by Capillary Hydro-Dynamic Flow using a Matec Applied Sciences model number CHDF 2000 instrument), DuPont Air Products Nano-Materials L.L.C., 2507 West Erie Drive, Tempe, Ariz. 85282.

B) Nitro-substituted sulfonic acid compounds: The nitro-substituted sulfonic acid compounds in this invention include, but are not limited to, the following nitro-substituted sulfonic acids:
1) 3-Nitrobenzenesulfonic acid: Aldrich Chemical Company, Inc, 1001 West St. Paul, Milwaukee, Wis. 53233.
2) 2,4-Dinitrobenzenesulfonic acid: Aldrich Chemical Company, Inc, 1001 West St. Paul, Milwaukee, Wis. 53233.

C) Per-compound oxidizing agents: The per-compound oxidizing agents in this invention include, but are not limited to, the following per-compound oxidizing agents:
1) Hydrogen Peroxide: a 30 weight % solution, Air Products and Chemicals, Inc., 7201 Hamilton Blvd. Allentown, Pa. 18195-1501.

D) Other co-additives with nitro-substituted sulfonic acid compounds and per-compound oxidizing agents in the polishing compositions: A list of other additives used in the polishing formulations is summarized below:
1) Potassium Hydroxide: Aldrich Chemical Company, Inc, 1001 West St. Paul, Milwaukee, Wis. 53233.
2) Aluminate surface-modified silica: prepared from potassium-stabilized colloidal silica (an approximately 30 weight % potassium-stabilized dispersion in water with a particle size of 50-60 nanometers as measured by Capillary Hydro-Dynamic Flow using a Matec Applied Sciences model number CHDF 2000 instrument), DuPont Air Products NanoMaterials L.L.C., 2507 West Erie Drive, Tempe, Ariz., 85282.
3) Potassium-stabilized colloidal silica: DuPont Air Products NanoMaterials L.L.C., 2507 West Erie Drive, Tempe, Ariz. 85282 (an approximately 30 weight % potassium-stabilized dispersion in water with a particle size of 50-60 nanometers as measured by Capillary Hydro-Dynamic Flow using a Matec Applied Sciences model number CHDF 2000 instrument.)

E) General
Black Diamond® Applied Producer® Black Diamond® chemical vapor deposition (CVD) film, a low k dielectric layer, Applied Materials, 3050 Boweres Avenue, Santa Clara, Calif. 95054.
PETEOS Plasma enhanced deposition of tetraethoxy silane; a dielectric oxide layer.
Blanket Wafers: Blanket wafers are those that have typically one type of surface prepared for polishing experiments.

PARAMETERS
Å: angstrom(s)—a unit of length
CMP: chemical mechanical planarization, or chemical mechanical polishing
min: minute(s)
ml: milliliter(s)
psi: pounds per square inch
rpm: revolution(s) per minute
TaN:BD1 Sel Tantalum nitride:Black Diamond® Selectivity—the ratio of the amount of tantalum nitride removed to the amount of Black Diamond® removed during CMP experiments using blanket wafers under identical conditions.
TaN:Cu Sel Tantalum nitride:Copper Selectivity—the ratio of the amount of tantalum nitride removed to the amount of copper removed during CMP experiments using blanket wafers under identical conditions.
TaN:PETEOS Sel Tantalum nitride:PETEOS Selectivity—the ratio of the amount of tantalum nitride removed to the amount of PETEOS removed during CMP experiments using blanket wafers under identical conditions.
Cu:BD1 Sel Copper:Black Diamond® Selectivity—the ratio of the amount of copper removed to the amount of Black Diamond® removed during CMP experiments using blanket wafers under identical conditions.
Cu:PETEOS Sel Copper:PETEOS Selectivity—The ratio of the amount of copper removed to the amount of PETEOS (dielectric material) removed during CMP experiments using blanket wafers under identical conditions.

EXAMPLES

General
All percentages are weight percentages and all temperatures are degrees Centigrade unless otherwise indicated.

Chemical Mechanical Planarization (CMP) Methodology
In the examples presented below, CMP experiments were run using the procedures and experimental conditions given below.

Metrology
PETEOS and Black Diamond thickness was measured with a Nanometrics, model, #9200, manufactured by Nanometrics Inc, 1550 Buckeye, Milpitas, Calif. 95035-7418. The metal films were measured with a ResMap CDE, model 168, manufactured by Creative Design Engineering, Inc, 20565 Alves Dr, Cupertino, Calif., 95014. This tool is a four-point probe sheet resistance tool. Twenty-five and forty nine-point polar scans were taken with the respective tools at 3-mm edge exclusion.

CMP Tool
The CMP tool that was used is a Mirra®, manufactured by Applied Materials, 3050 Boweres Avenue, Santa Clara, Calif. 95054. A Politex® embossed pad, supplied by Rohm and Haas Electronic Materials, 3804 East Watkins Street, Phoenix, Ariz., 85034, was used on the platen for the blanket wafer polishing studies.
In blanket wafers studies, polish time was 60 seconds per wafer. The Mirra® tool mid-point conditions for polishing blanket wafers were: platen (or table) speed 90 rpm; head speed 84 rpm; retaining ring pressure 3.0 psi; inter-tube pressure 3.0 psi; membrane pressure 2.0 psi; slurry flow 200 ml/min.

Blanket Wafers
Blanket wafer polishing experiments were conducted using Black Diamond®, PETEOS, CVD tantalum nitride, and electrochemically deposited copper wafers. The Black Diamond® wafers were purchased from Advanced Technology Development Facility (ATDF), 2706 Montopolis Drive, Austin, Tex. 78741. The Cu, PETEOS, and tantalum nitride blanket wafers were purchased from Silicon Valley Microelectronics, 1150 Campbell Ave, Calif. 95126. The blanket wafer film thickness specifications are summarized below:
Black Diamond®: 10,000 Å on silicon
Copper: 10,000 Å electroplated copper/1,000 Å copper seed/250 Å tantalum on silicon
PETEOS: 15,000 Å on silicon
Tantalum nitride: 3000 Å on 3,000 Å thermal oxide (on silicon)

Preparation of Boron Surface-Modified Colloidal Silica
Boron surface-modified colloidal silica having an average particle diameter of 50 to 60 nanometers, as measured by Capillary Hydro-Dynamic Flow using a Matec Applied Sciences model number CHDF 2000 instrument, was prepared using the following procedure.

Approximately 1 kg of Amberlite® IR-120 ion exchange resin (Rohm and Haas Company, Philadelphia, Pa.) was washed with 1 liter of 20% sulfuric acid solution. The mixture was stirred and the resin was allowed to settle. The aqueous layer was decanted and washed with 10 liters of deionized water. The mixture was again allowed to settle and then the aqueous layer was decanted. This procedure was repeated until the decanted water was colorless. This procedure afforded acid-state resin.

Potassium-stabilized silica (7.750 kg, DuPont Air Products NanoMaterials LLC, Tempe, Ariz.) was placed in a 5 gallon mix tank equipped with an agitator. The pH of the solution was measured to be approximately 10.2. With continued pH monitoring, small amounts of acid-state resin were added, while allowing the pH to stabilize in between additions. Additional resin was added in small portions until the pH had dropped to pH 1.90-2.20. Once this pH limit had been reached and was stable in this range, no further resin additions were made and the mixture was stirred for 1-1.5 hours. Subsequently the mixture was passed through a 500-mesh screen to remove the resin and afforded deionized silica.

Boric acid powder, 97.16 g (Fisher Scientific, 2000 Park Lane, Pittsburgh, Pa. 15275), was added to 2120 g of deionized water in a 5-gallon mixing tank equipped with an agitator. The boric acid solution was heated to 60° C., and maintained between 55° C. to 60° C. Deionized silica, 7284 g, was then added to the boric acid solution slowly over about 1.2 hours by adding it at approximately 102 ml/minute while maintaining the temperature between 55° C. to 60° C. After this addition was completed, the mixture was heated for an additional 5 hours. The resulting dispersion was subsequently filtered through a 1-micron filter to afford boron surface-modified colloidal silica.

Preparation of Potassium Aluminate Surface-Modified Colloidal Silica

Potassium aluminate surface-modified colloidal silica having an average particle diameter of 50 to 60 nanometers, as measured by Capillary Hydro-Dynamic Flow using a Matec Applied Sciences model number CHDF 2000 instrument, was prepared using the following procedure.

Approximately 1 kg of Amberlite® IR-120 ion exchange resin (Rohm and Haas Company, Philadelphia, Pa.) was washed with 1 liter of 20% sulfuric acid solution. The mixture was stirred and the resin was allowed to settle. The aqueous layer was decanted and washed with 10 liters of deionized water. The mixture was again allowed to settle and then the aqueous layer was decanted. This procedure was repeated until the decanted water was colorless. This procedure afforded acid-state resin.

Potassium-stabilized silica (3400 kg, DuPont Air Products NanoMaterials LLC, Tempe, Ariz.) was placed in a 5 gallon mix tank equipped with an agitator. The pH of the solution was measured to be approximately 10.2. With continued pH monitoring, small amounts of acid-state resin were added, while allowing the pH to stabilize in between additions. Additional resin was added in small portions until the pH had dropped to pH of 2.5. Once this pH limit had been reached and was stable in this range, no further resin additions were made and the mixture was stirred for 1-1.5 hours. Subsequently the mixture was passed through a 500-mesh screen to remove the resin and afforded deionized silica.

Potassium aluminate, 18.02 g of 50% solution (United States Aluminate Company, 9411 Philadelphia Ave, Suit H, Baltimore, Md. 21237) was added to 903 g of deionized water in a 3-gallon mixing tank equipped with an agitator. Under agitation, 12.03 g of potassium hydroxide was added to the potassium aluminate solution during a period of 3 minutes. The potassium aluminate solution was heated to 60° C., and maintained between 55° C. to 60° C. Deionized silica, 3069 g, was then added to the potassium aluminate solution at 58 ml/min while maintaining the temperature between 55° C. to 60° C. After this addition was completed, the mixture was heated for additional 4 hours. The resulting dispersion was subsequently filtered through a 1-micron filter to afford potassium aluminate surface-modified silica.

Examples 1-6

Example 1 (Comparative)

Procedure for Mixing the Polishing Slurry, 1.5 kg Batch Size

A polishing slurry was prepared comprising 2 weight % 3-nitrobenzenesulfonic acid, 5 weight % hydrogen peroxide, and 3 weight % unmodified colloidal silica abrasive; as described below and in Table 1. In a 3 liter beaker, 1099.6 g of deionized water were transferred, and maintained under agitation using a magnetic stirrer. Under agitation, 150 g of potassium-stabilized silica (30 weight % sol) was added over a period of 2 minutes. After completing the addition of silica, 0.35 g of potassium hydroxide (45 weight % solution) was added under agitation. After mixing for additional 5 minutes, 30 g of 3-nitrobenzenesulfonic acid was added during a period of 5 minutes. Finally, 250 g of hydrogen peroxide (30 weight % solution) was added to produce the formulated polishing slurry, prior to polishing blanket copper, tantalum nitride, Black Diamond®, and PETEOS wafers using a Mirra® CMP tool. The polishing slurry pH after addition of hydrogen peroxide was 8.5.

Polishing Slurry Mixing Procedure for Examples 2-6

For Examples 2-6, a procedure similar to Example 1 was used with minor variations; the polishing slurry compositions of Examples 2-6 are tabulated in Table 1. In each case, the balance of the composition was deionized water. Final pH adjustment was done using potassium hydroxide as indicated in Table 1.

Polishing Experiments for Examples 1-6

In Examples 1-6, CMP slurry compositions as shown in Table 1 were prepared and tested using the methodology, equipment, and processing as described supra. The weight % levels of 3-nitrobenzenesulfonic acid, weight % level of 2,4-dinitrobenzenesulfonic acid, weight % levels of abrasive, and weight % levels of hydrogen peroxide were varied as indicated below (and in Table 1):

Example 1, comparative example, 3-nitrobenzenesulfonic acid at 2 weight %; hydrogen peroxide at 5 weight %; potassium-stabilized colloidal silica abrasive at 3 weight %

Example 2, comparative example, 3-nitrobenzenesulfonic acid at 0 weight %; hydrogen peroxide at 5 weight %; potassium-stabilized colloidal silica abrasive at 3 weight %

Example 3, comparative example, 3-nitrobenzenesulfonic acid at 2 weight %; hydrogen peroxide at 0 weight %; potassium-stabilized colloidal silica abrasive at 3 weight %

Example 4, comparative example, 2,4-dinitrobenzenesulfonic acid at 2 weight %; hydrogen peroxide at 5 weight %; potassium-stabilized colloidal silica abrasive at 3 weight %

Example 5, 3-nitrobenzenesulfonic acid at 2 weight %; hydrogen peroxide at 5 weight %; boron surface-modified colloidal silica abrasive at 3 weight %

Example 6, comparative example, 3-nitrobenzenesulfonic acid at 2 weight %; hydrogen peroxide at 5 weight %; potassium aluminate surface-modified colloidal silica abrasive at 3 weight %

The Example 1-6 compositions were used to polish copper, PETEOS, Black Diamond® and tantalum nitride blanket wafers. The results of the polishing experiments such as copper removal rate at 2.0 psi membrane pressure, PETEOS removal rate at 2.0 psi membrane pressure, Black Diamond® removal rate at 2.0 psi membrane pressure, tantalum nitride removal rate at 2.0 psi membrane pressure, TaN:BD1 Sel at 2.0 psi membrane pressure, TaN:Cu Sel at 2.0 psi membrane pressure, TaN:PETEOS Sel at 2.0 psi membrane pressure, Cu:BD1 Sel at 2.0 psi membrane pressure, and Cu:PETEOS Sel at 2.0 psi membrane pressure are summarized in Table 1. As illustrated in Table 1, the results clearly demonstrate advantages of using nitro-substituted sulfonic acid compounds, per-compound oxidizing agents, and boron surface-modified abrasives in slurry compositions from the standpoint of high tantalum nitride removal rates. The effect of boron surface-modification of the abrasive on the removal rates of tantalum nitride, Black Diamond®, PETEOS, and copper using 3-nitrobenzenesulfonic acid, 2,4-dinitrobenzenesulfonic acid, and hydrogen peroxide is summarized below.

As shown in Table 1, Comparative Examples 1, 2, and 3 used unmodified potassium-stabilized colloidal silica. The slurry formulation in Comparative Example 2 with 3 weight % unmodified silica and 5 weight % hydrogen peroxide gave low removal rates for tantalum nitride (128 Å/min), copper (41 Å/min), PETEOS (22 Å/min), and Black Diamond® (92 Å/min). In comparison to Comparative Example 2, the formulation in Comparative Example 3 containing 3 weight % unmodified silica, no hydrogen peroxide, and 2 weight % 3-nitrobenzenesulfonic acid gave higher tantalum nitride (202 Å/min) and Black Diamond® removal rates (265 Å/min). Interestingly, the slurry formulation in Comparative Example 1, which contains 5 weight % hydrogen peroxide, 2 weight % 3-nitrobenzenesulfonic acid, and 3 weight % unmodified silica, gave a very high tantalum nitride removal rate (489 Å/min) and high Black Diamond® removal rate (288 Å/min), with low copper (83 Å/min) and PETEOS (85 Å/min) removal rates. Also, the formulation in Comparative Example 4, similar to Comparative Example 1 except that 3-nitrobenzenesulfonic acid was replaced with 2 weight % 2,4-dinitrobenzenesulfonic acid, and also containing 5 weight % hydrogen peroxide and 3 weight % unmodified silica gave a very high tantalum nitride removal rate (486 Å/min), a low copper removal rate (142 Å/min), and a low Black Diamond® removal rate (142 Å/min). Clearly, by comparing Comparative Examples 1 or 4 against Comparative Examples 2 and 3, a combination of 5 weight % hydrogen peroxide and 2 weight % of a nitro-substituted sulfonic acid compound suggests a synergy from the standpoint of tantalum nitride removal rate; 489 Å/min in Comparative Example 1; versus 128 Å/min in Comparative Example 2; versus 202 Å/min in Comparative Example 3; versus 486 Å/min in Comparative Example 4.

As shown in Table 1, the formulation in Example 5 contains 3 weight % boron surface-modified silica, 2 weight % 3-nitrobenzenesulfonic acid, and 5 weight % hydrogen peroxide. The removal rates for Example 5 are: tantalum nitride (596 Å/min); copper (68 Å/min); PETEOS (100 Å/min); and Black Diamond® (316 Å/min). The formulation in Example 5 is similar to Comparative Example 1 except that 3 weight % unmodified silica (Comparative Example 1) was replaced with 3 weight % boron surface-modified silica (Example 5). When compared against the formulation in Comparative Example 1, the slurry in Example 5 containing boron surface-modified silica has a significantly increased tantalum nitride removal rate (596 Å/min for Example 5, versus 489 Å/min for Comparative Example 1) while maintaining similar Black Diamond®, copper, and PETEOS removal rates. Clearly, by comparing Example 5 against Comparative Example 1 or Comparative Example 4, a combination of 3 weight % boron surface-modified silica, 5 weight % hydrogen peroxide, and 2 weight % of a nitro-substituted sulfonic acid compound suggests a synergy from the standpoint of tantalum nitride removal rate; 489 Å/min in Comparative Example 1; versus 486 Å/min in Comparative Example 4; versus 596 Å/min in Example 5. In Comparative Example 6, a potassium aluminate surface-modified silica was used instead of boron surface-modified silica, at 3 weight %. As shown in Table 1, interestingly, potassium aluminate surface-modified silica behaved very much like unmodified silica from the standpoint of removal rates of copper, tantalum nitride, PETEOS, and Black Diamond®. Clearly boron surface-modified silica are unique as the novel surface chemistry of boron surface-modified silica can increase tantalum nitride removal rates at low abrasive concentration.

Interestingly copper removal rates were low for Comparative Examples 1-4, Comparative Example 6, and Example 5. The low copper removal rates is believed to be due to higher passivation rate of copper at high concentration of hydrogen peroxide whereas passivation of tantalum is much lower in the presence of hydrogen peroxide. 3-nitrobenzenesulfonic acid and 2,4-dinitrobenzenesulfonic acid can complex with tantalum nitride ions to give a much higher removal rates while maintaining very low copper removal rates.

TABLE 1

Effect of Abrasive Surface-Modification on Copper, PETEOS, Tantalum Nitride, and Black Diamond ® Blanket Wafer Removal Rates and Removal Rate Selectivities Using Mixtures of 3-Nitrobenzenesulfonic acid or 2,4-Dinitrobenzenesulfonic acid with Hydrogen Peroxide

|  | Comparative Example 1 Unmodified silica | Comparative Example 2 Unmodified silica | Comparative Example 3 Unmodified silica | Comparative Example 4 Unmodified silica | Example 5 Boron surface-modified silica | Comparative Example 6 Potassium aluminate modified silica |
|---|---|---|---|---|---|---|
| Potassium stabilized silica (weight % silica) | 3 | 3 | 3 | 3 | 0 | 0 |
| Boron surface-modified colloidal silica (weight % silica) | 0 | 0 | 0 | 0 | 3 | 0 |
| Potassium aluminate surface-modified silica (weight % silica) | 0 | 0 | 0 | 0 | 0 | 3 |
| Potassium hydroxide (weight %) | 0.03 | 0.01 | 0.04 | 0.01 | 0.19 | 0.19 |
| 3-Nitrobenzenesulfonic acid (weight %) | 2 | 0 | 2 | 0 | 2 | 2 |
| 2,4-Dinitrobenzenesulfonic acid (weight %) | 0 | 0 | 0 | 2 | 0 | 0 |
| Hydrogen peroxide (weight %) | 5 | 5 | 0 | 5 | 5 | 5 |
| Deionized Water | Balance | Balance | Balance | Balance | Balance | Balance |
| Ph | 8.5 | 8.5 | 11.1 | 8.5 | 8.5 | 8.5 |
| Copper removal rate at 2.0 psi (Å/min) | 83 | 41 | not measured | 142 | 68 | 61 |
| PETEOS removal rate at 2.0 psi (Å/min) | 85 | 22 | not measured | not measured | 100 | 65 |
| Tantalum nitride removal rate at 2.0 psi (Å/min) | 489 | 128 | 202 | 486 | 596 | 497 |
| Black Diamond removal rate at 2.0 psi (Å/min) | 288 | 92 | 265 | 142 | 316 | 246 |
| TaN:BD1 Sel at 2.0 psi | 1.7 | 1.4 | 0.8 | 3.4 | 1.9 | 2.0 |
| TaN:Cu Sel at 2.0 psi | 5.9 | 3.1 | not measured | 3.4 | 8.8 | 8.1 |
| TaN:PETEOS Sel at 2.0 psi | 5.8 | 5.8 | not measured | not measured | 6.0 | 7.6 |
| Cu:BD1 Sel at 2.0 psi | 0.3 | 0.4 | not measured | 1.0 | 0.2 | 0.2 |
| Cu:PETEOS Sel at 2.0 psi | 1.0 | 1.9 | not measured | not measured | 0.7 | 1.1 |

The present invention has been set forth with regard to several preferred embodiments, however the present invention's full scope should not be limited to the disclosure of those embodiments, but rather the full scope of the present invention should be ascertained from the claims which follow.

What is claimed is:

1. A method of step 2 copper chemical-mechanical planarization, said method comprising the steps of:
   A) placing a substrate comprising copper, at least one dielectric material and at least one barrier material in contact with a polishing pad;
   B) delivering a step 2 chemical-mechanical planarization composition comprising
      a) a boron surface-modified abrasive;
      b) a nitro-substituted sulfonic acid compound;
      c) an oxidizing agent; and
      d) water;
   C) polishing the substrate with the step 2 copper chemical-mechanical planarization composition.

2. The method of claim 1 wherein the boron surface-modified abrasive is a colloidal boron surface-modified silica abrasive.

3. The method of claim 1 wherein the boron surface-modified abrasive is present at a weight percent level in the composition ranging from about 0.5 weight % to about 5 weight %.

4. The method of claim 1 wherein the nitro-substituted sulfonic acid compound is selected from the group consisting of 2-nitrobenzenesulfonic acid, 3-nitrobenzenesulfonic acid, 4-nitrobenzenesulfonic acid, and 2,4-dinitrobenzenesulfonic acid.

5. The composition of claim 1 wherein the nitro-substituted sulfonic acid compound is present at a weight percent level in the composition ranging from about 0.5 weight % to about 6 weight %.

6. The method of claim 1 wherein the oxidizing agent is a per-compound.

7. The method of claim 6 wherein the oxidizing agent comprises hydrogen peroxide present at a level ranging from 0.5 weight % to 6 weight % of the total weight of the composition.

8. The method of claim 1 wherein the composition has a pH ranging from 6 to 10.

9. The method of claim 1 further comprising e) a surfactant.

10. The method of claim 9 wherein the suffactant is a nonionic surfactant.

11. The method of claim 1 further comprising e) a corrosion inhibitor.

12. The method of claim 1, wherein the dielectric material comprises TEOS and the barrier material comprises TaN;
   wherein the step 2 chemical-mechanical planarization composition pH is basic, the boron-surface-modified abrasive comprises boron surface-modified silica abrasive and the oxidizing agent comprises a per-type oxidizer; and wherein during polishing the selectivity for tantalum nitride over TEOS is greater than 1 and the selectivity of tantalum nitride over copper is greater than 1.

13. The method of claim 12, wherein during polishing the selectivity for tantalum nitride over TEOS is at least 6 and the selectivity of tantalum nitride over copper is at least 8.8.

14. The method of claim 1 wherein the nitro-substituted sulfonic acid compound is 3-nitrobenzenesulfonic acid.

15. The method of claim 1 wherein the nitro-substituted sulfonic acid compound is 2,4-dinitrobenzenesulfonic acid.

16. The method of claim 1 wherein the nitro-substituted sulfonic acid compound comprises at least one of 3-nitro-4-hydroxy-benzenesulfonic acid; 3-nitro-5-hydroxy-benzenesulfonic acid; 2-nitro-4-hydroxy-benzenesulfonic acid; 2-hydroxy-4-nitro-benzenesulfonic acid; and 2-carboxy-4-nitrobenzenesulfonic acid.

17. The method of claim 1 wherein the nitro-substituted sulfonic acid compound comprises one or more nitro moieties and one or more sulfonate moieties attached to a ring structure where the ring is heterocyclic.

18. The method of claim 1 wherein the boron surface-modified abrasive is present at a weight percent level in the composition ranging from 0.01 weight % to 5 weight % of the total weight of the slurry.

19. The method of claim 1 wherein the at least one dielectric material on the substrate is a low-k carbon-doped oxide.

20. A method of step 2 copper chemical-mechanical planarization, said method comprising the steps of:
A) placing a substrate comprising copper, at least one dielectric material and at least one barrier material in contact with a polishing pad;
B) delivering a step 2 chemical-mechanical planarization composition comprising
a) a boron surface-modified abrasive present at a weight percent level in the composition ranging from about 0.5 weight % to about 5 weight %;
b) a nitro-substituted sulfonic acid compound present at a weight percent level in the composition ranging from about 0.5 weight % to about 6 weight %;
c) a per-compound oxidizing agent present at a level ranging from 0.5 weight % to 6 weight % of the total weight of the composition; and
d) water;
C) polishing the substrate with the step 2 copper chemical-mechanical planarization composition.

21. The method of claim 20 wherein the nitro-substituted sulfonic acid compound is 3-nitrobenzenesulfonic acid.

22. The method of claim 20 wherein the nitro-substituted sulfonic acid compound is 2,4-dinitrobenzenesulfonic acid.

23. The method of claim 20 wherein the at least one dielectric material on the substrate is a low-k carbon-doped oxide.

\* \* \* \* \*

UNITED STATES PATENT AND TRADEMARK OFFICE
CERTIFICATE OF CORRECTION

PATENT NO. : 7,678,702 B2 Page 1 of 1
APPLICATION NO. : 11/509223
DATED : March 16, 2010
INVENTOR(S) : Timothy Frederick Compton et al.

It is certified that error appears in the above-identified patent and that said Letters Patent is hereby corrected as shown below:

Column 19, Line 57

Insert -- water -- after the word agent

Signed and Sealed this

Fourth Day of May, 2010

David J. Kappos
*Director of the United States Patent and Trademark Office*